(12) United States Patent
Benzel et al.

(10) Patent No.: US 7,300,854 B2
(45) Date of Patent: *Nov. 27, 2007

(54) METHOD FOR PRODUCING A SEMICONDUCTOR COMPONENT HAVING A MOVABLE MASS IN PARTICULAR, AND SEMICONDUCTOR COMPONENT PRODUCED ACCORDING TO THIS METHOD

(75) Inventors: Hubert Benzel, Pliezhausen (DE); Heribert Weber, Nuertingen (DE); Frank Schaefer, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 305 days.

This patent is subject to a terminal disclaimer.

(21) Appl. No.: 10/451,775

(22) PCT Filed: Dec. 6, 2001

(86) PCT No.: PCT/DE01/04602

§ 371 (c)(1),
(2), (4) Date: Nov. 12, 2003

(87) PCT Pub. No.: WO02/051741

PCT Pub. Date: Jul. 4, 2002

(65) Prior Publication Data

US 2004/0065931 A1    Apr. 8, 2004

(30) Foreign Application Priority Data

Dec. 22, 2000 (DE) ............................... 100 64 494

(51) Int. Cl.
  *H01L 21/76* (2006.01)
  *H01L 21/20* (2006.01)
  *H01L 21/00* (2006.01)
(52) U.S. Cl. .................... 438/409; 438/53; 438/489; 438/960

(58) Field of Classification Search ................ 257/414, 257/254; 438/53, 411, 723, 409, 960, 52, 438/48, 421–422; 216/2; 73/504.12, 504.15, 73/514.02
See application file for complete search history.

(56) References Cited

U.S. PATENT DOCUMENTS 4,893,509 A * 1/1990 MacIver et al. ......... 73/514.29

(Continued)

FOREIGN PATENT DOCUMENTS

EP    0 584 777    3/1994

(Continued)

OTHER PUBLICATIONS

G. Lammel, "Free-Standing, Mobile 3D Porous Silicon Microstructures," sensors and Actuators 85 (2000) 356-360, Swiss Federal Institute of Technology, Lausanne (EPFL), Institute of Microsystems, CH-1015, Lausanne, Switzerland, accepted Dec. 21, 1999.

*Primary Examiner*—Shouxiang Hu
(74) *Attorney, Agent, or Firm*—Kenyon & Kenyon LLP

(57) ABSTRACT

A method of producing a semiconductor component, e.g., a multilayer semiconductor component, and a semiconductor component produced by this method, where the semiconductor component has, e.g., a mobile mass, i.e., an oscillator structure.

A method easily and inexpensively produce a micromechanical component having monocrystalline oscillator structures, such as an acceleration sensor or a rotational rate sensor for example, by surface micromechanics, a first porous layer is formed in the semiconductor component in a first step and a cavity, i.e., a cavern, is formed beneath or out of the first porous layer in the semiconductor component in a second step.

23 Claims, 4 Drawing Sheets

U.S. PATENT DOCUMENTS

| | | | |
|---|---|---|---|
| 4,945,769 A * | 8/1990 | Sidner et al. | 73/727 |
| 5,242,863 A * | 9/1993 | Xiang-Zheng et al. | 438/53 |
| 5,352,635 A | 10/1994 | Tu et al. | |
| 5,405,786 A * | 4/1995 | Kurtz | 438/53 |
| 5,542,558 A * | 8/1996 | Benz et al. | 216/2 |
| 5,594,171 A * | 1/1997 | Ishida et al. | 73/514.32 |
| 6,359,276 B1 * | 3/2002 | Tu | 250/338.1 |
| 7,037,438 B2 * | 5/2006 | Benzel et al. | 216/2 |
| 7,160,750 B2 * | 1/2007 | Benzel et al. | 438/48 |

FOREIGN PATENT DOCUMENTS

| | | |
|---|---|---|
| EP | 0 895 276 | 2/1999 |
| EP | 0895276 * | 2/1999 |

* cited by examiner

METHOD FOR PRODUCING A SEMICONDUCTOR COMPONENT HAVING A MOVABLE MASS IN PARTICULAR, AND SEMICONDUCTOR COMPONENT PRODUCED ACCORDING TO THIS METHOD

BACKGROUND INFORMATION

The present invention is directed to a method for producing a semiconductor component, e.g., a multilayer semiconductor component, and to a semiconductor component produced by this method, the semiconductor component having a mobile mass, i.e., an oscillator structure.

Some semiconductor components such as micromechanical acceleration sensors or rotational rate sensors in particular have a mobile mass, i.e., an oscillator structure. Such sensors are usually produced from polycrystalline silicon by surface micromechanics, the oscillator structure being created by etching away a sacrificial silicon oxide layer by gas phase etching so the oscillator structure is freely mobile.

Surface micromechanics for production of acceleration sensors or rotational rate sensors may be complex and therefore expensive. In comparison with an oscillator structure of monocrystalline silicon, it may be possible to produce oscillator structures of polycrystalline silicon with a greater range of variation in the mechanical properties. Furthermore, they may have inferior long-term stability.

The methods of producing such sensors by surface micromechanics are not generally compatible with the typical methods of producing semiconductor circuit elements.

SUMMARY

An example embodiment of the method according to the present invention may have the advantage over the related art that a micromechanical component having monocrystalline oscillator structures, e.g., an acceleration sensor or a rotational rate sensor, may be produced easily and inexpensively by surface micromechanics.

An example embodiment of the present invention may include a cavern, i.e., a cavity, in a semiconductor substrate such as a silicon substrate by using an etching medium. To do so, the cover layer of the substrate may be etched in the area of the cavern to be produced subsequently, so that openings, i.e., etching openings such as pores, i.e., cavities, are formed in it. The etching medium or one or more other etching media may pass through the etching openings, i.e., the pores which are open to the outside, and reach deeper areas of the substrate. The part of the semiconductor substrate decomposed by the etching medium and/or the additional etching media in this area may be removed through the openings, i.e., the pores in the cover layer and/or through an external access opening to this area. The cover layer may have a thickness of, e.g., approx. 2 µm to 10 µm, e.g., 3 µm to 5 µm. A mostly monocrystalline epitaxial layer may be deposited on the porous cover layer.

In the case of an access opening, a porous cover layer may be used, having a thickness of, e.g., approx. 40 µm to 80 µm, e.g., 50 µm to 60 µm instead of a porous cover layer of approx. 2 µm to 10 µm. The purpose of the greater thickness is that the cover layer may function as an etching stop layer in etching the access opening and thus permitting a reliable etching stop before reaching a mostly monocrystalline epitaxial layer deposited on the cover layer.

To produce a semiconductor component having a mobile mass, i.e., an oscillator structure, such as an acceleration sensor or a rotational rate sensor, the mostly monocrystalline epitaxial layer deposited on the cover layer, i.e., the porous cover layer, may be structured by one or more operations so that a mobile mass, i.e., an oscillator structure of the sensor is formed entirely or partially from it. The structuring may be performed by using known dry etching techniques.

In an example embodiment of the present invention, electric and/or electronic semiconductor components may be produced in the monocrystalline epitaxial layer and/or in the monocrystalline mobile mass, i.e., mobile structure, i.e., oscillator structure formed from the monocrystalline epitaxial layer, e.g., by suitable doping. In a conventional manner, electric and/or electronic circuit elements may be integrated into a monocrystalline epitaxial layer, i.e., into a monocrystalline mobile mass.

In comparison with an oscillator structure conventionally formed from polycrystalline silicon, a mobile mass, i.e., an oscillator structure formed from monocrystalline silicon of the epitaxial layer, may be formed such that a mobile mass of monocrystalline silicon may be produced to have a small range of variation in the mechanical properties. Furthermore, such oscillator structures produced from monocrystalline silicon according to the present invention may have a good long-term stability.

In an example embodiment of the present invention, the operation of etching the porous cover layer may ensure that the rate of expansion of the pores in the cover layer is lower, possibly much lower, than the rate of expansion of the pores, i.e., cavities, in the area of the substrate which forms the subsequent cavity, i.e., cavern.

According to an example embodiment of the present invention, this may be achieved by selecting the etching parameters and/or the etching medium or media in etching the pores in the cover layer to be different from the etching parameters and/or the etching medium or etching media in etching the pores, i.e., cavities in the area of the subsequent cavern.

The porosity of the cover layer for removal of the silicon to be decomposed for production of the caverns may be adjustable to be adequately large in a manner that is well controllable in terms of the process technology. On the other hand, however, the cavern may be produced rapidly and thus inexpensively.

According to an example embodiment of the present invention, the etching parameters may be adjusted and/or the etching medium or media may be selected in etching the cavern so that the expansion rate of the pores, i.e., cavities is so high that the pores, i.e., cavities very rapidly "overlap" one another. This results first in a single, largely superficial starting cavity in the substrate, which expands in depth over a period of time and forms the cavern.

As an example embodiment of the present invention, which is an alternative to the immediately preceding embodiment, the etching parameters and/or the etching medium or media may be selected in etching the cavern so that the porosity of the area of the substrate which forms the subsequent cavern is greater than the porosity of the cover layer. The substrate may be a monocrystalline silicon substrate. The precursor of the subsequent cavern may have a porosity of more than 80%. The cavern may be formed subsequently from the porous area of the substrate by performing one or more controlled heating steps, e.g., at a temperature above approx. 900° C.

In controlled heating, e.g., in an atmosphere of hydrogen, nitrogen or a noble gas, e.g., at temperatures above approx. 900° C., the pores in the area of the silicon which will form the subsequent cavern are rearranged at a porosity of more than approx. 80%, so that a single large pore, i.e., a cavity, i.e., a cavern is formed beneath the low-porosity cover layer, i.e., starting layer, for an epitaxial layer to be deposited subsequently. The pores on the top side of the low-porosity layer, i.e., the starting layer, are mostly sealed in this high-temperature step, so that a largely monocrystalline silicon layer may be deposited on the starting layer to form a starting layer for producing one or more mobile masses.

According to an example embodiment of the present invention, the etching medium or the etching media for producing the openings and/or pores in the cover layer and/or for producing the cavern is hydrofluoric acid (HF) or a liquid mixture or a chemical compound that contains hydrofluoric acid.

In an example embodiment of the present invention, a readily volatile component, e.g., an alcohol such as ethanol and/or purified water, is added to the etching medium or the etching media to dilute the etching medium or etching media.

Ethanol reduces the surface tension of an etching medium to which it is added, thus permitting better wetting of the silicon surface and better penetration of the etching medium into the etched pores, i.e., openings, i.e., cavities. Furthermore, the bubbles which are formed during the etching process are smaller than those formed without the addition of ethanol to the etching medium, and thus the bubbles are better able to escape through the pores of the cover layer. It is therefore possible to keep the pore size, i.e., the porosity of the cover layer smaller than without the addition of the alcohol.

In another example embodiment of the present invention, the openings, i.e., pores in the cover layer and/or in the area of the subsequent cavern are produced by an electrochemical method, e.g., using the etching medium or the etching media mentioned above.

Furthermore, in an example embodiment of the present invention using an electrochemical etching method, e.g., an etching method using hydrofluoric acid (HF), the rate of expansion of the pores, i.e., cavities formed in the etching process may be influenced by applying an electric voltage and an electric current produced thereby through the etching medium or the etching media. The rate of expansion of the pores, i.e., cavities may depends, e.g., on the doping of the silicon substrate to be etched, the current density, the HF concentration in the etching medium, if present, and the temperature. It is self-evident that these are only examples of relevant parameters of an exemplary etching method according to the present invention.

According to an example embodiment of the present invention, the etching medium, the HF concentration in the etching medium and/or the doping of the area to be etched and/or the temperature and, if appropriate, other process parameters of the etching method may be selected, so that the etching process, i.e., the formation of pores, i.e., cavities, may be adjusted in a suitable manner and/or stopped when the electric voltage is turned off, possibly rather abruptly.

In an exemplary electrochemical etching method according to the present invention using a single etching medium and/or two or more etching media, a first current density, which is not necessarily constant over time, may be established in the etching medium in a first period of time during which the etching medium is in the area of the cover layer. During a second period of time when the particular etching medium is in the area of the cavern to be created, a second current density may be established which is not necessarily constant over time and is higher or much higher than the or a current density established during the first period of time.

This results in formation of the cavern or a precursor of the cavern through pores, i.e., cavities, having a rate of expansion during the etching of the cavern that is higher or much higher than the rate of expansion of the pores for producing the porous cover layer.

In another example embodiment of the present invention, the area of the cover surface of the substrate to be etched to form pores may be surrounded by a mask layer, i.e., a supporting layer, before the etching process, thereby permitting free access of the etching medium or the etching media to the area to be etched with pores and shielding the areas of the cover surface of the substrate which are not to be etched to form pores to prevent etching attack there.

According to an example embodiment of the present invention, the supporting layer may be designed so that it mechanically secures the area, which is to be etched to form pores and/or the layer of the cover surface which is to be etched to form pores, on the unetched portion of the substrate during and after etching of the cavern.

In an example embodiment of the present invention, the supporting layer may be created before etching the area which is to be etched to form pores and/or the layer which is to be etched by providing at least the nearest surrounding area around the layer of the cover surface which is to be etched to form pores in a p-doped silicon substrate with an n-doping. In this way it is possible to largely prevent "undercutting" of the substrate, e.g., in the area where the layer which is etched to form pores is mechanically joined to the silicon substrate. Otherwise there may be the risk, e.g., in the case of a thin porous layer, i.e., starting layer, that it would become detached from the substrate. In addition, a silicon nitride layer may be used as a mask and, e.g., for protection against an etching attack of electronic circuits situated beneath the mask.

Alternatively or additionally, instead of the n-doping, i.e., an n-doped layer, a metal layer or metal mask may also be provided, likewise to largely prevent undercutting of the substrate. Use of a metal layer, i.e., metal mask, is usually expedient, however, if no circuits are to be provided in the substrate because otherwise metal atoms remaining in the substrate even after removal of the metal layer, i.e., metal mask, might impair the functioning of the circuits.

In another example embodiment of the present invention, a cover layer which is etched to form pores, such as a silicon layer, is to be pretreated before an epitaxial layer, e.g., a largely monocrystalline silicon layer, is applied, i.e., deposited on it. The pretreatment is performed with the goal of partially or entirely closing the pores in the cover layer, i.e., starting layer which is etched to form pores, to further improve the quality of the largely monocrystalline silicon layer, if necessary or expedient.

A pretreatment according to the present invention may include heating the cover layer, i.e., starting layer which is etched to form pores, in a controlled manner to a high temperature, e.g., at a temperature in the range of approx. 900° C. to approx. 1100° C. This controlled heating may be performed in an atmosphere of hydrogen, nitrogen and/or noble gas.

As an alternative or in addition to the pretreatment mentioned above, (slight) oxidation of the silicon starting layer which is etched to form pores may be provided. This oxidation may be performed with (slight) addition of oxygen into the atmosphere to which the starting layer is exposed in the reactor, the oxidation may be performed at a temperature in the range of approx. 400° C. to 600° C. The term "slight" is understood to refer to oxidation which causes some or all of the pores of the starting layer to be closed and forms an approximately mesh-like oxide structure. According to an example embodiment of the present invention, the oxide structure may cover as little of the surface of the porous etched starting layer as possible in order to ensure that a possibly monocrystalline silicon layer is deposited on the starting layer, so that a mobile mass may be formed from it subsequently, e.g., by dry etching techniques. The oxidation may be removed, if necessary, in a process step following the oxidation process until this desired state is obtained.

In an example embodiment of the present invention, the thickness of the starting layer may be much smaller than the thickness of the silicon layer deposited on it, so the physical properties of the at least one mobile mass, i.e., oscillator structure, thus created are determined largely by the silicon layer, the thickness of which is easily adjustable through the process technology.

According to an example embodiment of the present invention, the low-porosity layer, i.e., starting layer, for the deposition of an epitaxial layer may be created using an etching medium having a hydrofluoric acid (HF) concentration in the range of approx. 20% to approx. 50%, e.g., approx. 30% to approx. 40%, e.g., approx. 33%.

In another example embodiment of the present invention, the porous layer which forms a precursor of the subsequent cavity, i.e., cavern, is etched with an etching medium having a hydrofluoric acid (HF) concentration in the range of approx. 0% to approx. 40%, e.g., approx. 5% to 20%, e.g., less than approx. 20%. The remaining amount of etching medium which is not formed by hydrofluoric acid is composed mostly of an alcohol, e.g., ethanol.

An etching medium according to the present invention may be provided in an example embodiment of the present invention to achieve a high rate of expansion of the pores, i.e., cavities, in the layer which is to be decomposed during an aforementioned etching step according to the present invention to form a cavity, i.e., a cavern, so that the pores, i.e., cavities, will very rapidly "overlap" with one another and thus form a single "giant pore." The etching medium according to an example embodiment of the present invention may have a hydrofluoric acid (HF) concentration in the range of approx. 0% to approx. 5%, preferably approx. 1% to approx. 3%, e.g., less than approx. 5%. The remainder of this etching medium not formed by hydrofluoric acid may be made up mostly of an alcohol, e.g., ethanol and/or purified water.

DETAILED DESCRIPTION

Figure 1:
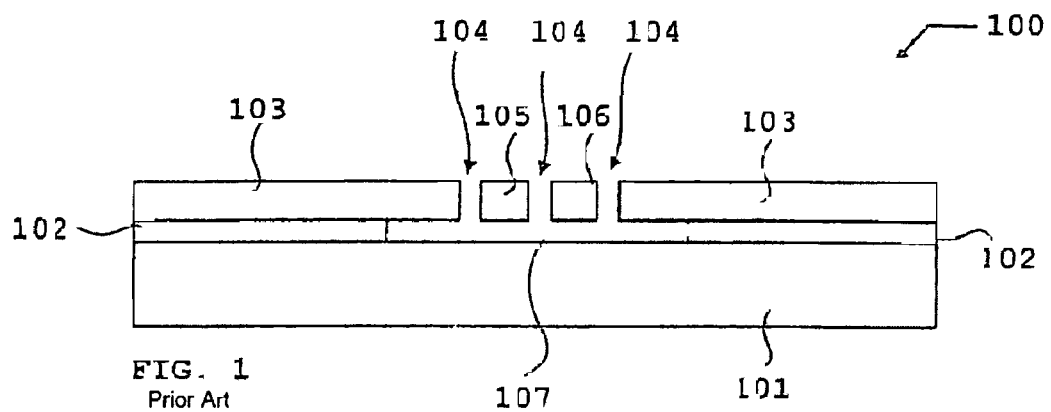
FIG. 1 shows a cross section of a precursor of an acceleration sensor having two mobile masses, i.e., two oscillator structures.

FIG. 1 shows precursor 100 of a known acceleration sensor. Precursor 100 has a silicon substrate 101 of monocrystalline silicon, a sacrificial silicon oxide layer 102 deposited on silicon substrate 101 and a polysilicon layer 103 of polycrystalline silicon deposited on sacrificial silicon oxide layer 102. An etching mask (not shown) is applied to precursor 100 in a known way, so that etching openings 104 are not covered by the etching mask. The top side of precursor 100 shown in FIG. 1 is subsequently etched in a known way, thus creating, i.e., forming, mobile masses 105 and 106 in polysilicon layer 103 and a cavern, i.e., a cavity, 107 in sacrificial silicon oxide layer 102, as shown in FIG. 1.

One disadvantage of this method of producing precursor 100 of a conventional acceleration sensor as shown in FIG. 1 is that the mobile masses have fluctuations in their mechanical properties in mass production due to the polysilicon structure. Furthermore, there are great fluctuations in the dimensions of the cavity.

Figure 2:
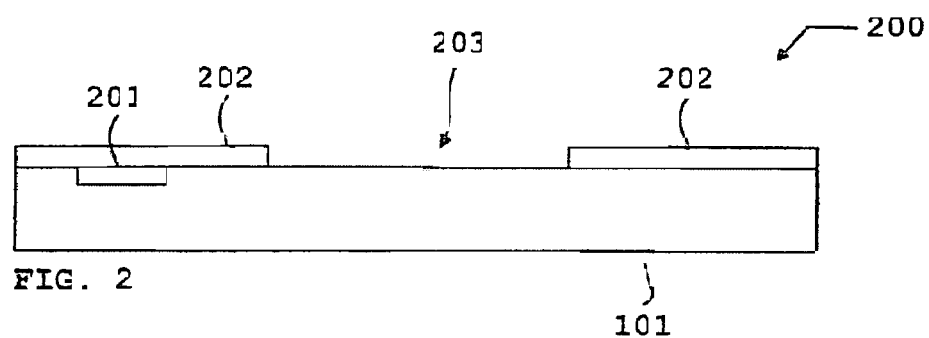
FIG. 2 shows a cross section of a precursor for forming a first acceleration sensor according to an example embodiment of the present invention.

FIG. 2 shows a cross section of a conventional precursor 200 for forming a first acceleration sensor according to an example embodiment of the present invention. Conventional precursor 200 has a monocrystalline silicon substrate 101, electronic circuit elements, i.e., circuits 201 integrated into monocrystalline silicon substrate 101, and an etching mask 202 on the top of monocrystalline silicon substrate 101, an etching opening 203 being provided in etching mask 202.

Figure 3:
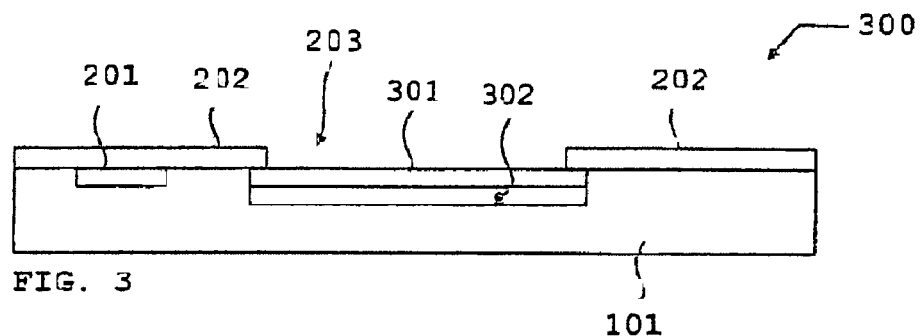
FIG. 3 shows a cross section of another precursor of the first acceleration sensor according to an example embodiment of the present invention, produced on the basis of the precursor illustrated in FIG. 2 and having a monocrystalline porous layer and a cavern, i.e., a cavity, formed beneath the porous layer.

FIG. 3 shows another precursor 300 of the first acceleration sensor according to an example embodiment of the present invention produced on the basis of the known precursor shown in FIG. 2. To produce precursor 300 from precursor 200 shown in FIG. 2, the area defined by etching opening 203 is etched electrochemically to make it porous by using one or more etching media containing hydrofluoric acid, as explained in detail above. The porosity is controlled by the current density in the etching medium, the doping of the silicon, and the composition of the etching medium. To form porous monocrystalline silicon layer 301, the etching process is controlled so that porous monocrystalline silicon layer 101 has a low porosity. After porous monocrystalline silicon layer 301 has been produced, the current density in the etching medium is increased above a critical level and/or the composition of the etching medium is altered so that the "pores" beneath porous layer 301 become so large that the material of silicon substrate 101 is completely etched out of area 302, and the cavern, i.e., cavity 302, is created beneath porous monocrystalline silicon layer 301. The silicon of silicon substrate 101 decomposed by the etching medium may be removed through the pores of the porous layer or through a separate access opening.

Figure 4:
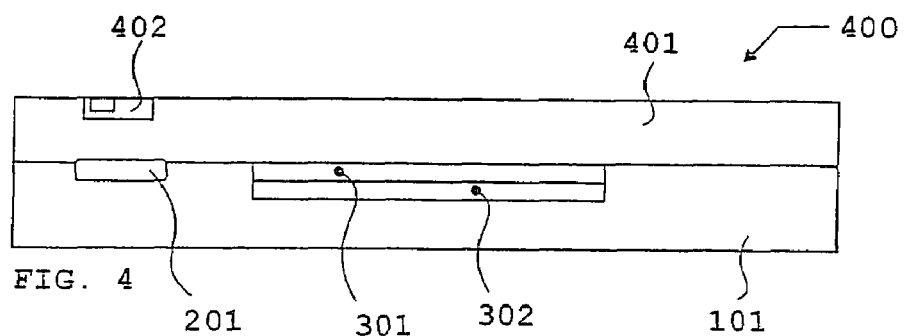
FIG. 4 shows a cross section of another precursor of the first acceleration sensor according to an example embodiment of the present invention, produced on the basis of the precursor shown in FIG. 3 and having an epitaxial layer and an electronic circuit element or circuits integrated into it.

FIG. 4 shows another precursor 400 of the first acceleration sensor according to an example embodiment of the present invention, which was produced on the basis of precursor 300 shown in FIG. 3. Precursor 400 has silicon substrate 101, electronic circuit elements, i.e., circuits 201, integrated into silicon substrate 101, porous monocrystalline silicon layer 301, and the cavern, i.e., cavity 302. An epitaxial monocrystalline silicon layer 401 has been deposited on porous monocrystalline silicon layer 301. Deposition of an epitaxial monocrystalline silicon layer on porous monocrystalline silicon layer 301 according to the present invention is made possible by the fact that with a suitably low porosity of porous silicon layer 301, it is possible to deposit a mostly monocrystalline epitaxial layer on porous monocrystalline silicon layer 301. Epitaxial monocrystalline silicon layer 401 seals the cavern, i.e., cavity 302, so that the pressure prevailing in the epitaxial process for deposition of epitaxial monocrystalline silicon layer 401 determines the pressure enclosed in cavity 302. In the example embodiment illustrated in FIG. 4, additional electronic circuit elements, i.e., circuits 402 or the like are produced by standard semiconductor methods, e.g., by suitable doping of epitaxial monocrystalline silicon layer 401.

To improve the quality of epitaxial monocrystalline silicon layer 401, porous monocrystalline silicon layer 301 may, if necessary, be pretreated as already explained above.

Figure 5:
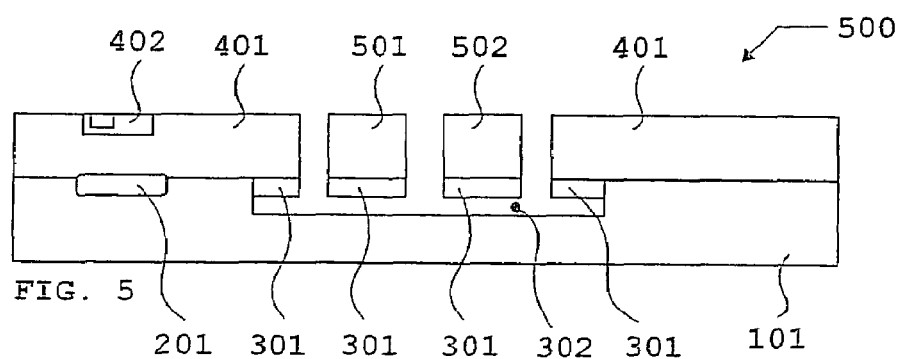
FIG. 5 shows a cross section of another precursor of the first acceleration sensor according to an example embodiment of the present invention, produced on the basis of the precursor illustrated in FIG. 4 and having the mobile masses, i.e., oscillator structures, formed from the epitaxial layer.

FIG. 5 shows another precursor 500 of the first acceleration sensor according to an example embodiment of the present invention, which was formed on the basis of precursor 400 illustrated in FIG. 4.

Precursor 500 has silicon substrate 101, electronic circuit elements, i.e., circuits 201 integrated into silicon substrate 101, cavern, i.e., cavity 302, and two mobile masses 501 and 502 which may be formed by conventional dry etching techniques from epitaxial monocrystalline silicon layer 401 and porous monocrystalline silicon layer 301. Furthermore, the electronic circuit elements, i.e., circuits 402, have been integrated into epitaxial monocrystalline silicon layer 401 by appropriate standard semiconductor processes, e.g., suitable doping.

When precursor 100 of a conventional acceleration sensor having two mobile masses 105 and 106, as shown in FIG. 1, is compared with precursor 500 of a first acceleration sensor according to the present invention, as shown in FIG. 5, it is seen that mobile masses 501 and 502—in contrast with mobile masses 105 and 106 made of polysilicon—have been formed from monocrystalline silicon of epitaxial monocrystalline silicon layer 401 and to a slight extent also from porous monocrystalline silicon layer 301. On the basis of the defined material parameters of monocrystalline silicon, mobile masses 501 and 502 may be formed in a reproducible manner with only minor fluctuations in their mechanical properties. Furthermore, electronic circuit elements, i.e., circuits 402, may be integrated into epitaxial monocrystalline silicon layer 401 of precursor 500, which may not be possible with a polysilicon layer 103 using standard semiconductor processes.

Movements of the mobile masses, i.e., oscillator structures 501 and 502, and optionally other masses may be analyzed capacitively, for example. For a capacitive analysis, mobile masses 501 and 502 and possibly also other mobile masses, may be formed as interdigital structures from epitaxial monocrystalline silicon layer 401. Interdigital structures are understood to refer to structures composed of at least one first structure and one second structure. Each first and second structure has a plurality of finger-shaped masses, some of them mobile, with one finger of the first structure being situated between two adjacent fingers of the second structure. The first structure forms a first stationary capacitor plate, and the second structure forms a second mobile capacitor plate. Such interdigital structures have a high sensitivity for determining acceleration acting on the second structure.

As an alternative, however, piezoresistive resistors may also be provided on mobile masses 501 and 502 as well as other masses to determine the acceleration or deflection of the mobile masses, i.e., oscillator structures. In addition, it is also possible to provide a capacitor in precursor 500 shown in FIG. 5 to deflect mobile masses 501 and 502 in a controlled manner when a voltage is applied, e.g., for test purposes. This deflection or acceleration is then determined by capacitive or piezoresistive means in the manner described above.

Figure 6:
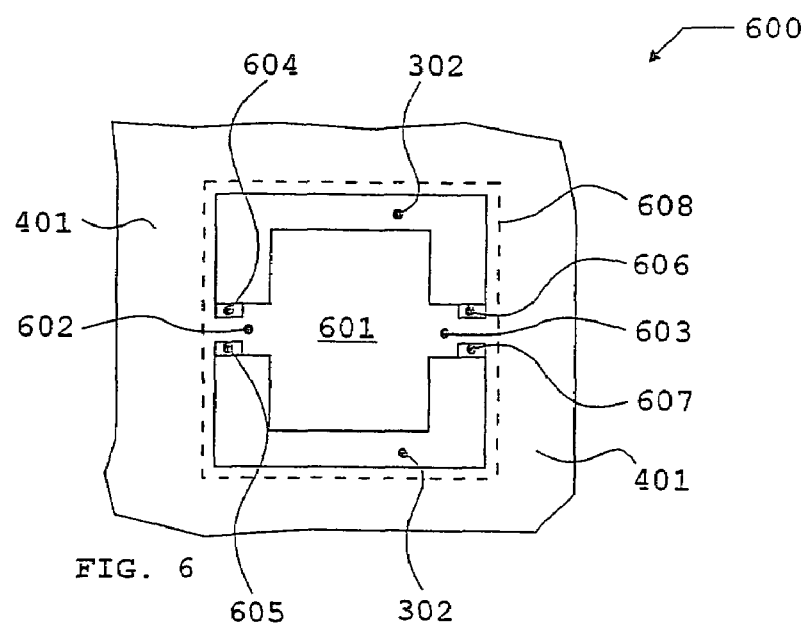
FIG. 6 shows a top view of a precursor of a second acceleration sensor according to an example embodiment of the present invention, produced on the basis of the precursor illustrated in FIG. 4 and having a mobile mass, i.e., an oscillator structure, the acceleration or deflection of which is detected by piezoresistive resistors.

FIG. 6 shows a top view of a precursor 600 of a second acceleration sensor according to an example embodiment of the present invention, formed on the basis of precursor 400 shown in FIG. 4. In contrast with precursor 500 of a first acceleration sensor according to an example embodiment of the present invention as shown in FIG. 5, precursor 600 of the second acceleration sensor according to an example embodiment of the present invention has a single mobile mass 601, which has a large area in relation to masses 501 and 502 and is connected by fastening arms 602 and 603 to epitaxial monocrystalline silicon layer 401. The cavern, i.e., cavity 302, is situated beneath large-area mobile mass 601. Mobile mass 601 is elastically suspended on epitaxial monocrystalline silicon layer 401 due to an appropriate design of fastening arms 602 and 603, so that large-area mobile mass 601 is able to oscillate in X direction, i.e., in the direction of the top or bottom edges of the page, as well as in Z direction, i.e., into and out of the page. It is possible to implement an acceleration sensor by using precursor 600 shown in FIG. 6, so that it detects acceleration in both X and Z directions and thus also detects the associated deflection of large-area mobile mass 601. The deflection or acceleration of large-area mobile mass 601 is analyzed by using piezoresistive resistors 604 through 607, piezoresistive resistors 604 and 605 being situated in fastening arm 602, which functions as the first elastic suspension of mobile mass 601, and piezoresistive resistors 606 and 607 being situated in second fastening arm 603, which functions as the second elastic suspension of mobile mass 601. Dotted line 608 shows the edge of the area of porous etching, i.e., the edge of porous monocrystalline silicon layer 301, which is adjacent to silicon substrate 101.

When large-area mobile mass 601 is accelerated in the X direction, i.e., in the direction of the top edge or the bottom edge of the page, both upper piezoresistive resistors 604 and 606 undergo the same change in resistance, this change being opposite the change in resistance of the two lower piezoresistive resistors 605 and 607. When large-area mobile mass 601 is accelerated in the Z direction, i.e., into or out of the plane of the page, all piezoresistive resistors 604, 605, 606 and 607 undergo the same change in resistance. For example, the piezoresistive resistors may be wired to form a Wheatstone bridge for detecting the acceleration or deflection of large-area mobile mass 601.

Large-area mobile mass 601, which is made of monocrystalline silicon of epitaxial monocrystalline silicon layer 401, may be created from it by conventional dry etching techniques, e.g., by trench etching.

Figure 7:
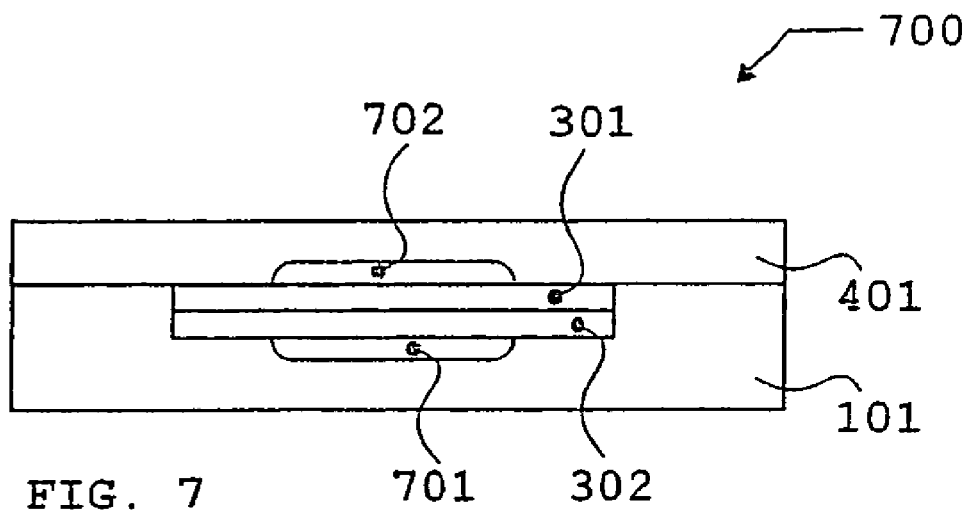
FIG. 7 shows a cross section (along line A-A in FIG. 8) of a precursor of a third acceleration sensor according to an example embodiment of the present invention, produced on the basis of the precursor illustrated in FIG. 4 and having a mobile mass, i.e., oscillator structure, the acceleration or deflection of which is determined capacitively.

FIG. 7 shows a cross section (along line A-A in FIG. 8) of precursor 700 of a third acceleration sensor according to an example embodiment of the present invention, produced on the basis of precursor 400 shown in FIG. 4. Precursor 700 of the third acceleration sensor according to the present invention has silicon substrate 101, a bottom electrode 701, a cavern, i.e., a cavity 302, a porous monocrystalline silicon layer 301, an epitaxial monocrystalline silicon layer 401, and a cover electrode 702. Bottom electrode 701 has a doped area in which the doping has been introduced into silicon substrate 101 before the porous etching of silicon substrate 101. The doped region forming bottom electrode 701 may extend deeper into silicon substrate 101 than the porous etched region, i.e., porous monocrystalline silicon layer 301. Cover electrode 702 is formed by a doped region in which the doping is performed before deposition of epitaxial monocrystalline silicon layer 401.

Figure 8:
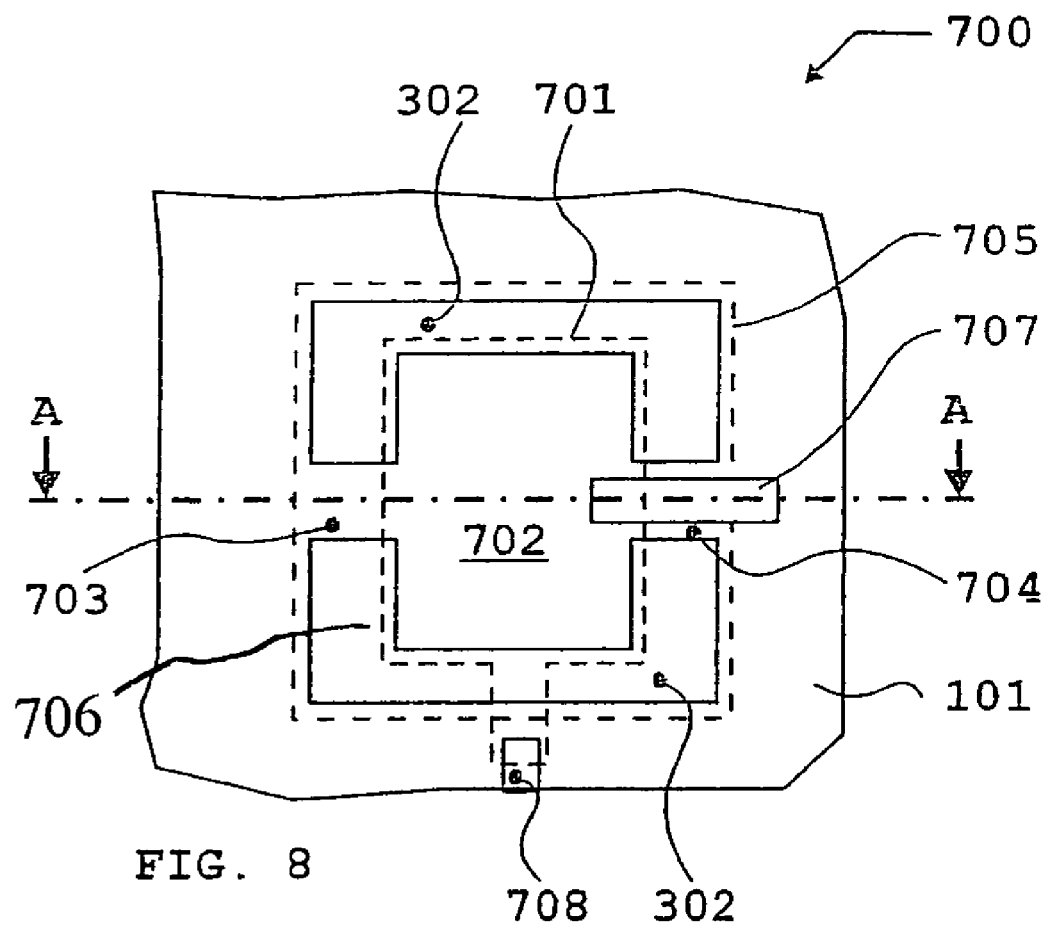
FIG. 8 shows a top view of the precursor of the third acceleration sensor according to an example embodiment of the present invention having capacitive analysis, as shown in FIG. 7.

FIG. 8 shows a top view of precursor 700 of the third acceleration sensor according to an example embodiment of the present invention as illustrated in FIG. 7. Top view 800 of precursor 700 shows cover electrode 702, which is a mobile mass having a large area in relation to masses 501 and 502. Cover electrode 702 is suspended by elastic suspension on silicon substrate 101 by fastening arms 703 and 704. Outer dotted line 705 indicates the edge of porous etched region 302 adjacent to silicon substrate 101. Inner dotted line 706 shows bottom electrode 701, which is essentially concealed beneath cover electrode 702 and is provided in silicon substrate 101. An electric terminal 707 is provided to detect movement of the cover electrode due to an acceleration acting on the cover electrode and a resulting change in capacitance between the cover electrode and the bottom electrode which form a capacitor, this terminal extending from cover electrode 702 to silicon substrate 101 via fastening arm 704. Furthermore, a terminal 708 is provided which contacts bottom electrode 701 and is connected to silicon substrate 101. Terminals 707 and 708 are preferably formed by suitably doped regions in epitaxial monocrystalline silicon layer 401 and in silicon substrate 101. In comparison with stationary bottom electrode 701, cover electrode 702 is deflectable in the Z direction, i.e., into and out of the plane of the page, when an acceleration acts on the cover electrode, i.e., the third acceleration sensor according to an example embodiment of the present invention. The deflection or acceleration of the cover electrode may be detected and analyzed capacitively via the capacitor system formed by the cover electrode and the bottom electrode.

Figure 9:
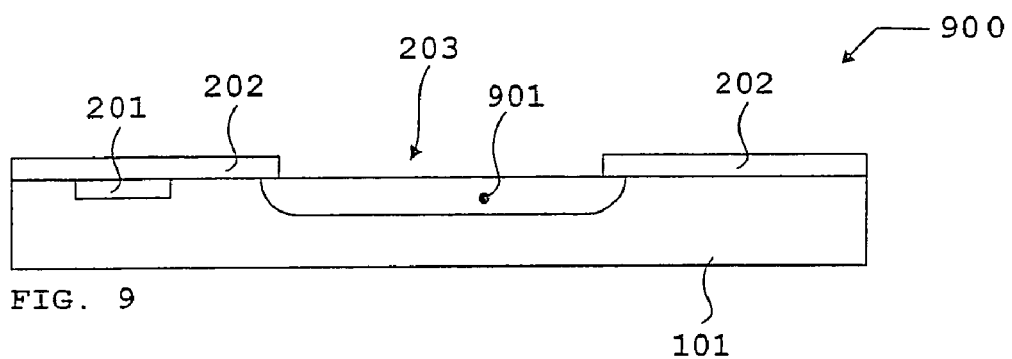
FIG. 9 shows a cross section of another precursor of the first, second or third acceleration sensor according to the present invention, produced on the basis of the known precursor shown in FIG. 2, as an alternative to the precursor shown in FIG. 3.

FIG. 9 shows an alternative to precursor 300 shown in FIG. 3 for the first, second, or third acceleration sensor according to an example embodiment of the present invention. In contrast with the precursor shown in FIG. 3, precursor 900 shown in FIG. 9 has a porous monocrystalline silicon layer 901 whose thickness largely corresponds to the total thickness of the combination of monocrystalline silicon layer 301 and the cavern, i.e., cavity 302. Porous monocrystalline silicon layer 901 may be formed, e.g., by the measures explained above in detail.

Figure 10:
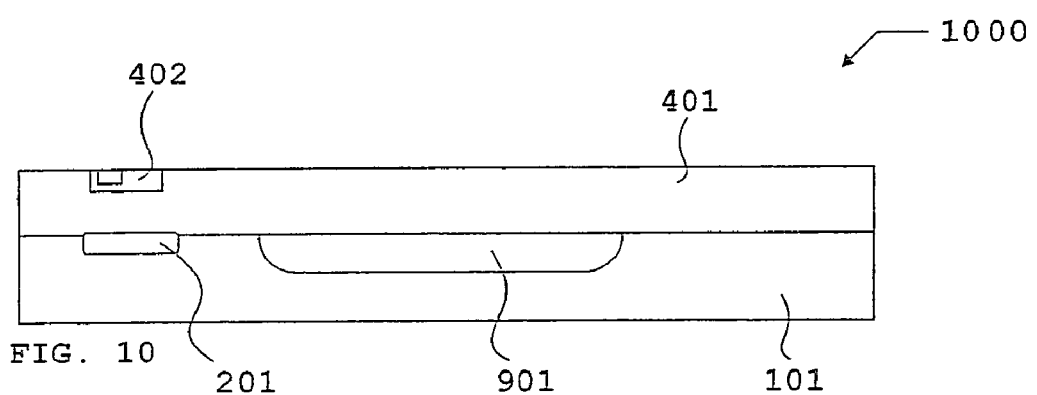
FIG. 10 shows a cross section of another precursor produced on the basis of the precursor illustrated in FIG. 9.

The alternative shown in FIG. 10 to precursor 400 shown in FIG. 4 for formation of the first, second or third acceleration sensor according to an example embodiment of the present invention differs from precursor 400 shown in FIG. 4 in that epitaxial layer 401 has been deposited on porous monocrystalline silicon layer 901 and on the top of monocrystalline silicon substrate 101 of precursor 900.

Figure 11:
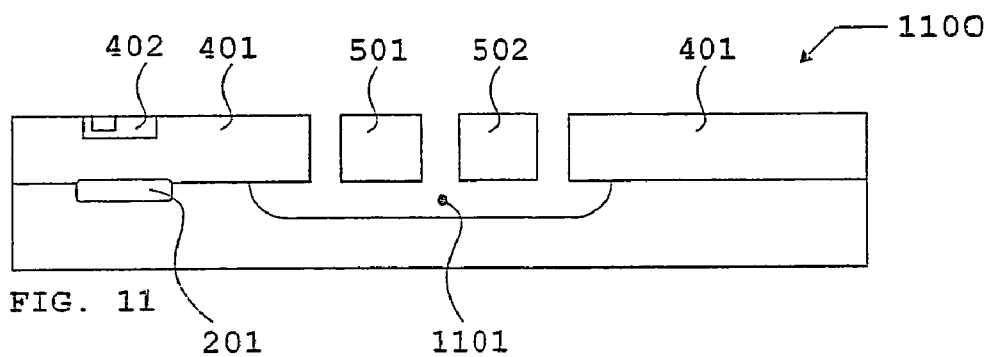
FIG. 11 shows a cross section of another precursor formed on the basis of the precursor illustrated in FIG. 10.

The alternative shown in FIG. 11 to precursor 500 shown in FIG. 5 differs from precursor 500 shown in FIG. 5 in that porous monocrystalline silicon layer 901 of precursor 1000 has been removed, i.e., etched away, in producing mobile masses 501 and 502 as described in conjunction with FIG. 5. A cavern, i.e., a cavity 1101, is formed due to the removal of porous monocrystalline silicon layer 901.

The alternatives shown in FIGS. 9 through 11 to the precursors shown in FIGS. 3 through 5 have the advantage over the related art that the total complexity for producing mobile masses 501 and 502 and the cavern, i.e., cavity 1101, is reduced due to the measures described above. To form the cavern, i.e., cavity 1101, shown in FIG. 11, it may not be necessary to adjust the etching parameters so that first a porous monocrystalline silicon layer 101 is formed and then a cavern, i.e., a cavity 102, is formed by changing the etching parameters. Instead, without change in etching parameters, an entire porous monocrystalline silicon layer 901 may be formed and then removed or etched away from epitaxial layer 401 in etching, i.e., forming, mobile masses 501 and 502 described above.

What is claimed is:

1. A method for producing a semiconductor component, comprising:
   forming a first porous layer in a semiconductor substrate;
   forming a cavity beneath the first porous layer in the semiconductor substrate; and
   depositing an epitaxial layer on the first porous layer;
   wherein the semiconductor component is arranged as one of an acceleration sensor and a rotational rate sensor.

2. The method according to claim 1, wherein the semiconductor substrate is made of silicon.

3. The method according to claim 1, wherein the cavity is configured as a cavern.

4. The method according to claim 1, wherein the cavity forming step includes the substep of forming an initially superficial cavity beneath the first porous layer, the initially superficial cavity arranged to expand into the depth of the cavity so that the cavity is formed from the initially superficial cavity.

5. The method according to claim 4, further comprising selecting process parameters for forming, adjacent to the first porous layer, at least a second porous layer including the initially superficial cavity so that a rate of expansion of pores in the second porous layer is higher than a rate of expansion of pores in the first porous layer.

6. The method according to claim 5, wherein the process parameters for forming the initially superficial cavity are selected in the selecting step so that the pores in the second porous layer overlap one another in a lateral direction forming a single, initially superficial pore.

7. The method according to claim 5, wherein the process parameters include at least one of a doping of the semiconductor substrate to be etched, a current density in the etching medium, a hydrofluoric acid concentration in the etching medium, at least one additive to the etching medium, and a temperature.

8. The method according to claim 1, wherein the epitaxial layer includes a silicon layer.

9. The method according to claim 1, wherein the epitaxial layer is mono crystalline.

10. The method according to claim 1, wherein the semiconductor component is arranged as at least one of a multilayer semiconductor component and a micromechanical component.

11. A method for producing a semiconductor component, comprising:
   forming a first porous layer in a semiconductor substrate;
   forming a cavity beneath the first porous layer in the semiconductor substrate; and
   depositing an epitaxial layer on the first porous layer;
   wherein the cavity forming step includes the substep of forming a second porous layer beneath the first porous layer, the second porous layer having a porosity of more than approximately 70% and less than 100% and
   wherein the semiconductor component is arranged as one of an acceleration sensor and a rotational rate sensor.

12. The method according to claim 11, wherein the second porous layer has a porosity between approximately 85% and 95%.

13. The method according to claim 11, wherein the cavity is formed in the cavity forming step in the second porous layer by controlled heating.

14. The method according to claim 11, wherein at least one of the first porous layer and the second porous layer is formed by at least one etching medium.

15. The method according to claim 14, where the etching medium includes hydrofluoric acid.

16. The method according to claim 14, wherein the etching medium includes at least one additive.

17. The method according to claim 16, wherein the additive is adapted to at least one of reduce formation of bubbles, improve wetting and improve drying.

18. The method according to claim 16, wherein the additive includes an alcohol.

19. The method according to claim 16, wherein the additive includes ethanol.

20. The method according to claim 16, wherein a volume concentration of the additive is between approximately 60% and 100%.

21. The method according to claim 11, wherein at least one of the first porous layer and the second porous layer is formed while applying an electric field between a top and a bottom of the semiconductor component and adjusting an electric current.

22. A method for producing a semiconductor component, comprising:
   forming a first porous layer in a semiconductor substrate;
   forming a cavity beneath the first porous layer in the semiconductor substrate; and
   depositing an epitaxial layer on the first porous layer;
   wherein the epitaxial layer is structured so that at least one mobile mass is formed one of partially and entirely from the epitaxial layer, and wherein the mobile mass is configured as an oscillator structure of one of an acceleration sensor and a rotational rate sensor.

23. The method according to claim 22, further comprising removing the first porous layer while forming the at least one mobile mass.

* * * * *